(12) United States Patent
Yen et al.

(10) Patent No.: US 11,881,448 B2
(45) Date of Patent: Jan. 23, 2024

(54) SEMICONDUCTOR PACKAGE STRUCTURE HAVING SUBSTRATE WITH EMBEDDED ELECTRONIC COMPONENT AND CONDUCTIVE PILLARS

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US); Kay Stefan Essig, Radebeul (DE)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 187 days.

(21) Appl. No.: 17/315,067

(22) Filed: May 7, 2021

(65) Prior Publication Data

US 2022/0359363 A1 Nov. 10, 2022

(51) Int. Cl.
*H01L 23/498* (2006.01)
*H01L 21/48* (2006.01)

(52) U.S. Cl.
CPC .... *H01L 23/49838* (2013.01); *H01L 21/4814* (2013.01); *H01L 23/49822* (2013.01)

(58) Field of Classification Search
CPC .......... H01L 23/49838; H01L 21/4814; H01L 23/49822
USPC ........................................................ 257/686
See application file for complete search history.

(56) References Cited

U.S. PATENT DOCUMENTS

| 8,405,213 B2 * | 3/2013 | Chen | H01L 24/19 257/737 |
| 8,878,353 B2 * | 11/2014 | Haba | H05K 1/11 438/109 |
| 2010/0244208 A1 * | 9/2010 | Pagaila | H01L 23/50 257/659 |
| 2016/0079214 A1 * | 3/2016 | Caskey | H01L 21/486 257/686 |
| 2019/0051590 A1 | 2/2019 | Fang et al. | |
| 2019/0363039 A1 | 11/2019 | Appelt et al. | |
| 2019/0393297 A1 | 12/2019 | Kung et al. | |
| 2020/0335443 A1 * | 10/2020 | Sun Zhou | H01L 21/4857 |
| 2022/0199581 A1 * | 6/2022 | Pu | H01L 23/5383 |

\* cited by examiner

*Primary Examiner* — Michael Jung
(74) *Attorney, Agent, or Firm* — FOLEY & LARDNER LLP

(57) ABSTRACT

A semiconductor package structure and a method for manufacturing a semiconductor package structure are provided. The semiconductor package structure includes a first package and a second package. The first package includes a first substrate, an electronic component, a trace layer, and a first conductive structure. The first substrate has a first surface and a second surface opposite to the first surface. The electronic component is embedded in the first substrate. The trace layer has an uppermost conductive layer embedded in the first substrate and exposed from the first surface of the first substrate. The first conductive structure electrically connects the trace layer to the second surface of the first substrate. The second package is disposed on the first surface of the first substrate of the first package.

17 Claims, 20 Drawing Sheets

SEMICONDUCTOR PACKAGE STRUCTURE HAVING SUBSTRATE WITH EMBEDDED ELECTRONIC COMPONENT AND CONDUCTIVE PILLARS

BACKGROUND

1. Technical Field

The present disclosure relates generally to a semiconductor package structure and a method for manufacturing a semiconductor package structure.

2. Description of the Related Art

System-in-package (SIP) technology which incorporates passive components and dies into a single package has become increasingly widely used, especially in automobile applications. However, passive components usually have relatively large sizes, and thus it is difficult to reduce the size of the entire package including passive components.

SUMMARY

In one or more embodiments, a semiconductor package structure includes a first package and a second package. The first package includes a first substrate, an electronic component, a trace layer, and a first conductive structure. The first substrate has a first surface and a second surface opposite to the first surface. The electronic component is embedded in the first substrate. The trace layer has an uppermost conductive layer embedded in the first substrate and exposed from the first surface of the first substrate. The first conductive structure electrically connects the trace layer to the second surface of the first substrate. The second package is disposed on the first surface of the first substrate of the first package.

In one or more embodiments, a semiconductor package structure includes a first package and a second package. The first package includes a first substrate, an electronic component, a trace layer, a first conductive pillar, and a first conductive via. The first substrate has a first surface and a second surface opposite to the first surface. The electronic component is embedded in the first substrate. The trace layer is proximal to the first surface of the first substrate. The first conductive pillar is connected to the trace layer. The first conductive via connects the first conductive pillar to the second surface of the first substrate. The first conductive via and the first conductive pillar are within a same medium of the first substrate. The second package is disposed on the first surface of the first substrate of the first package.

In one or more embodiments, a method of manufacturing a semiconductor package structure includes the following operations: forming a conductive pillar on a first surface of a trace layer; forming a conductive via on the conductive pillar; providing an electronic component; forming a dielectric layer to cover the trace layer, the conductive pillar, the conductive via, and the electronic component; and disposing a package on a second surface opposite to the first surface of the trace layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
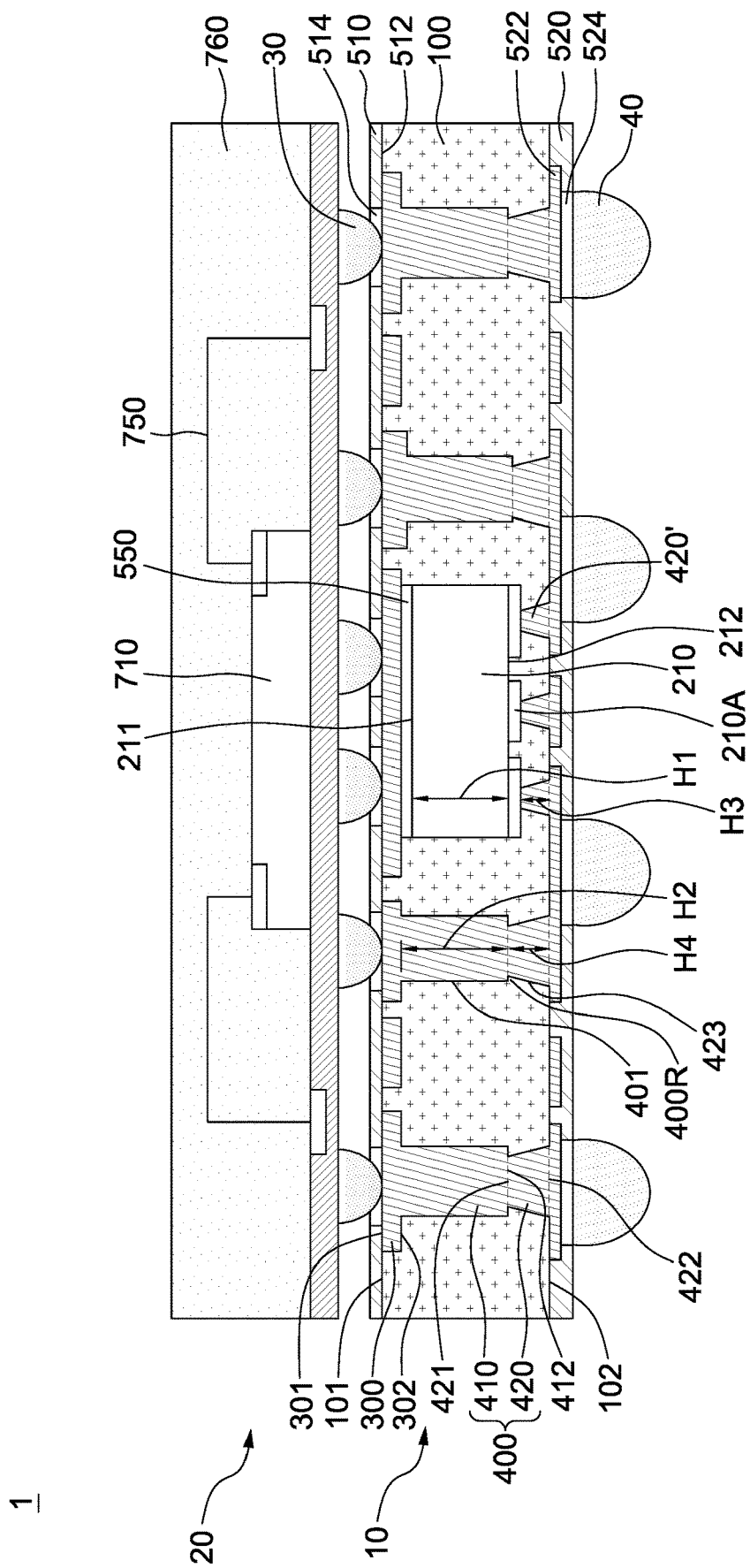
FIG. 1 illustrates a cross-sectional view of a semiconductor package structure in accordance with some embodiments of the present disclosure.

FIG. 1 illustrates a cross-sectional view of a semiconductor package structure 1 in accordance with some embodiments of the present disclosure. The semiconductor package structure 1 includes packages 10 and 20, conductive elements 30, and electrical contacts 40.

The package 10 may include a substrate 100, one or more electronic components 210, a trace layer 300, conductive structures 400 and 420', and one or more dielectric layers 510 and 520.

In some embodiments, the substrate 100 has a surface 101 and a surface 102 opposite to the surface 101. The substrate 100 may include, for example, a printed circuit board, such as a paper-based copper foil laminate, a composite copper foil laminate, or a polymer-impregnated glass-fiber-based copper foil laminate. In some embodiments, the substrate 100 may be or include a dielectric layer. The dielectric layer may include phosphoric anhydride (PA), polyimide (PI), polybenzoxazole (PBO), PP, an ABF, a molding compound, an epoxy compound, an epoxy-based material, a pre-preg material, or the like.

The electronic component 210 is embedded in the substrate 100. In some embodiments, the electronic component 210 is embedded in the dielectric layer (i.e., the substrate 100). The electronic component 210 has an active surface 212 and a back surface 211 (also referred to as backside) opposite to the active surface 212. The back surface 211 of the electronic component 210 may be adhered to a portion of the trace layer 300 through an adhesive layer 550 (e.g., a DAF). The electronic component 210 may include one or more pads 210A in proximity to, adjacent to, or embedded in and exposed at the active surface 212 of the electronic component 210. The electronic component 210 may be a chip or a die including a semiconductor substrate, one or more integrated circuit devices, and one or more overlying interconnection structures therein. The electronic component 210 may include one or more active devices such as transistors and/or one or more passive devices such resistors, capacitors, inductors, or a combination thereof.

The trace layer 300 is proximal to the surface 101 of the substrate 100. In some embodiments, the trace layer 300 has an uppermost conductive layer that is embedded in the substrate 100 and exposed from the surface 101 of the substrate 100. In some embodiments, a surface 301 of the trace layer 300 is exposed from the surface 101 of the substrate 100. In some embodiments, the surface 301 of the uppermost conductive layer of the trace layer 300 is substantially coplanar with the surface 101 of the substrate 100. In some embodiments, the trace layer 300 has a surface 302 opposite to the surface 301 and a plurality of lateral surfaces extending between the surfaces 301 and 302, and the surface 302 as well as the lateral surfaces of the trace layer 300 are embedded in or covered by the substrate 100. In some embodiments, the trace layer 300 includes a patterned metal layer. In some embodiments, the trace layer 300 may be or include a conductive material such as a metal or metal alloy. Examples include gold (Au), silver (Ag), aluminum (Al), copper (Cu), or an alloy thereof. In some embodiments, the trace layer 300 and the dielectric layer (i.e., the substrate 100) form an embedded trace substrate (ETS). In some embodiments, the ETS including the high-density trace layer is capable of providing high I/O counts, which is advantageous to achieve complex trace design.

In comparative embodiments, a first package is bonded to a second package through a redistribution layer and includes bump pads on the upper surface of the redistribution layer for solder-bonding, the bump pads are protruded out of the upper surface of the first package and thus may be easily damaged in the manufacturing processes or in transportation. Moreover, it requires separate multiple manufacturing operations to form the redistribution layer and the bump pads (e.g., forming a redistribution layer, forming electronic components encapsulated by an encapsulant on the redistribution layer, and flipping over the as-formed structure to form bump pads on the redistribution layer), thus the manufacturing process is more complex, and the costs are undesirably increased. In addition, each of the bump pads is connected to the first package (e.g., the redistribution layer of the first package) through one bottom surface thereof and to the second package through one upper surface of the first package, and thus the adhesion of the bump pads through merely two opposite surfaces is relatively less stable.

In contrast, according to some embodiments, the trace layer 300, which may be referred to as an embedded trace layer, is embedded within the substrate 100 and not protruded out of the upper surface (i.e., the surface 101) of the package 10 facing the package 20, and thus the trace layer 300 can be protected by the substrate 100 without being damaged in the manufacturing processes or in transportation, which effectively increases the reliability of the trace layer 300 as well as the package 10. Moreover, it does not further require multiple manufacturing operations to form a redistribution layer and bump pads, thus the manufacturing process is simplified, and the costs are reduced. In addition, the trace layer 300 is adhered to the substrate 100 through all of the lateral surfaces and the embedded bottom surface (i.e., the surface 302), and thus the adhesion between the trace layer 300 and the substrate 100 is relatively stable, which can further increase the reliability of the trace layer 300 as well as the semiconductor package structure 1 effectively. Moreover, the yield of the semiconductor package structure 1 can be increased, and the electronic performance of the semiconductor package structure 1

The conductive structure 400 electrically connects the trace layer 300 to the surface 102 of the substrate 100. In some embodiments, the package 10 includes one or more conductive structures 400. In some embodiments, the electronic component 210 and the conductive structures 400 are arranged side-by-side. In some embodiments, the conductive structure 400 includes a conductive pillar 410 and a conductive via 420 connected to the conductive pillar 410. In some embodiments, the conductive structure 400 passes through the substrate 100 (or the dielectric layer) to connect to the trace layer 300. In some embodiments, a sum of a height of the conductive pillar 410 and a height of the conductive via 420 is equal to or less than a height of the substrate 100 (or the dielectric layer).

In some embodiments, the conductive pillar 410 is between the trace layer 300 and the conductive via 420. In some embodiments, the conductive pillar 410 is connected to the trace layer 300. In some embodiments, the conductive pillar 410 directly contacts the trace layer 300. In some embodiments, a height H1 of the electronic component 210 is equal to or less than a height H2 of the conductive pillar 410. In some embodiments, the conductive pillar 410 and the electronic component 210 are arranged side-by-side. In some embodiments, the conductive pillar 410 and the electronic component 210 are at the substantially the same elevation.

In some embodiments, the conductive via 420 connects the conductive pillar 410 to the surface 102 of the substrate 100. In some embodiments, the conductive via 420 is exposed from the surface 102 of the substrate 100. In some embodiments, a surface 422 of the conductive via 420 is exposed from the surface 102 of the substrate 100. In some embodiments, the surface 422 of the conductive via 420 is substantially coplanar with the surface 102 of the substrate 100. In some embodiments, the conductive via 420 has a surface 421 opposite to the surface 422. In some embodiments, an area of the surface 421 of the conductive via 420 is smaller than an area of the surface 422 of the conductive via 420. In some embodiments, a surface 412 of the conductive pillar 410 directly contacts the surface 421 opposite to the surface 422 of the conductive via 420. In some embodiments, the area of the surface 421 of the conductive via 420 is smaller than an area of the surface 412 of the conductive pillar 410.

In some embodiments, the conductive pillar 410 and the conductive via 420 are within a same medium of the substrate 100. For example, the substrate 100 may include a homogeneous medium, and the conductive pillar 410 and the conductive via 420 are both within the same homogeneous medium, and there is free of a heterogeneous interface within the substrate 100. In some embodiments, the substrate 100 is a monolithic layer formed of a single medium, and the conductive pillar 410 and the conductive via 420 are within the single medium of the substrate 100. For example, the substrate 100 is a monolithic dielectric layer, and the conductive pillar 410 and the conductive via 420 are within the monolithic dielectric layer.

In some embodiments, the conductive structure 400 has a lateral surface 401 extending between the surface 101 and the surface 102 of the substrate 100. In some embodiments, the conductive structure 400 has a recess 400R that is recessed from the lateral surface 401 of the conductive structure 400. In some embodiments, the recess 400R is defined by the conductive pillar 410 and the conductive via 420. In some embodiments, the recess 400R is defined by a bottom surface (e.g., the surface 412) of the conductive pillar 410 and a lateral surface (e.g., surface 423) of the conductive via 420. In some embodiments, the substrate 100 may be or include a dielectric layer that is adjacent to the conductive pillar 410 and the conductive via 420. In some embodiments, a portion of the dielectric layer (or the substrate 100) extends into the recess 400R of the conductive structure 400. In some embodiments, the extended portion of the dielectric layer (or the substrate 100) conforms to a morphology of the recess 400R.

In some embodiments, the conductive structure 420' may be or include a conductive via. In some embodiments, the package 10 includes one or more conductive structures 420'. In some embodiments, the conductive structure 420' (or the conductive via) is connected to the electronic component 210. In some embodiments, the conductive via 420 and the conductive structure 420' (or the conductive via) are arranged side-by-side. In some embodiments, the conductive via 420 and the conductive structure 420' (or the conductive via) are at the same elevation. In some embodiments, the conductive structure 420' (or the conductive via) is connected to a pad 210A of the electronic component 210. In some embodiments, a height H3 of the conductive structure 420' (or the conductive via) is equal to or less than a height H4 of the conductive via 420.

In comparative embodiments, a relatively long conductive pillar passes through a dielectric layer of a first package to connect a solder ball on a first side of the first package to a second package at a second side opposite to the first side of the first package. The aforesaid structure is formed by plating a conductive pillar, covering the conductive pillar by a dielectric layer, followed by removing portions of the dielectric layer and the conductive pillar by grinding for providing a planarized exposed surface of the conductive pillar for electrical connection. With the aforesaid grinding operation, warpage of the first package may easily occur due to the grinding force applied on the package structure. In addition, the higher the conductive pillar is formed, the wider the conductive pillar is formed accordingly, and thus the lateral dimension of the aforesaid conductive pillar is undesirably relatively large. Moreover, while a structure having a relatively high aspect ratio may be less stable in terms of its structural strength and thereby more vulnerable to possible damages, therefore the manufacturing process for forming relatively high pillars may suffer from a decrease in yields.

In contrast, according to some embodiments of the present disclosure, the conductive structure 400, which is implemented as a composite structure including the conductive pillar 410 and the conductive via 420, is not formed of an entire and long conductive pillar and is not formed by a grinding operation either. Therefore, warpage of the package 10 which could have been caused by applying a grinding force in a grinding operation does not occur on the package 10, and thus the stability and the structural strength of the package 10 can be increased. Accordingly, the manufacturing yield can be increased, and the costs can be reduced.

In addition, according to some embodiments of the present disclosure, while the conductive pillar 410 only constructs a portion of the entire conductive structure 400, the relatively less height of the conductive pillar 410 renders it possessing a smaller width, and the conductive via 420 can be made having a relatively small lateral dimension as well. Therefore, the lateral dimension of the conductive structure 400 can be reduced effectively. The reduced lateral dimension of the conductive structure 400 is advantageous to increasing the compatibility of the conductive structure 400 to the high-density embedded trace layer 300 that is capable of providing high I/O counts, and thus the overall routing density (e.g., the line width/line space (L/S) or the pitch of the entire interconnection structure including the trace layer 300 and the conductive structures 400) can be increased, which is advantageous to achieve complex trace design.

In some embodiments, the dielectric layer 510 is on the surface 101 of the substrate 100. In some embodiments, a bottom surface 512 of the dielectric layer 510 is substantially coplanar with the surface 301 of the trace layer 300. In some embodiments, the bottom surface 512 of the dielectric layer 510 directly contacts the surface 301 of the trace layer 300. In some embodiments, the dielectric layer 510 includes a solder mask or a solder resist.

In some embodiments, the dielectric layer 520 is on the surface 102 of the substrate 100. In some embodiments, the package 10 may further include a conductive layer 522 electrically connected to the conductive via 420. In some embodiments, the dielectric layer 520 and the conductive layer 522 may form an interconnection layer or a redistribution layer. In some embodiments, the dielectric layer 520 may include an organic material, a solder mask, PI, an ABF, one or more molding compounds, one or more pre-impregnated composite fibers (e.g., a pre-preg material), a borophosphosilicate glass (BPSG), silicon oxide, silicon nitride, silicon oxynitride, an undoped silicate glass (USG), any combination thereof, or the like.

The package 20 may be disposed on the surface 101 of the substrate 100 of the package 10. In some embodiments, the package 20 is electrically connected to the surface 301 of the trace layer 300 of the package 10. The package 20 may include a substrate 700, an electronic component 710, bonding wires 750, and an encapsulant 760.

The substrate 700 may include, for example, a printed circuit board, such as a paper-based copper foil laminate, a composite copper foil laminate, or a polymer-impregnated glass-fiber-based copper foil laminate. The substrate 700 may include an interconnection structure, such as a plurality of conductive traces, conductive pads, and/or conductive through vias. The electronic component 710 may be a chip or a die including a semiconductor substrate, one or more integrated circuit devices, and one or more overlying interconnection structures therein. The electronic component 710 may include one or more active devices such as transistors and/or one or more passive devices such resistors, capacitors, inductors, or a combination thereof. In some embodiments, the electronic component 710 is electrically connected to the substrate 700 through the bonding wires 750, and the encapsulant 760 encapsulated the substrate 700, the electronic component 710, and the bonding wires 750.

The conductive elements 30 may electrically connect the package 20 to the package 10. In some embodiments, the conductive elements 30 may include conductive bumps. In some embodiments, the conductive bump may be or include Au, Ag, Cu, another metal, a solder alloy, or a combination of two or more thereof. In some embodiments, a conductive protection layer 514 (e.g., a metal finish) may be on the exposed surface 301 of the trace layer 300, and the conductive element 30 directly contacts the conductive protection layer 514.

The electrical contacts 40 may be on the surface 102 of the substrate 100 of the package 10. In some embodiments, the pad 210A of the electronic component 210 is electrically connected to the electrical contact 40 through the conductive structure 420' (or the conductive via). In some embodiments, the electrical contact 40 may include a solder ball. In some embodiments, the electrical contact 40 may include a controlled collapse chip connection (C4) bump, a ball grid array (BGA) or a land grid array (LGA). In some embodiments, a conductive protection layer 524 (e.g., a metal finish) may be on the exposed surface of the conductive layer 522, and the electrical contact 40 directly contacts the conductive protection layer 524.

Figure 1A:
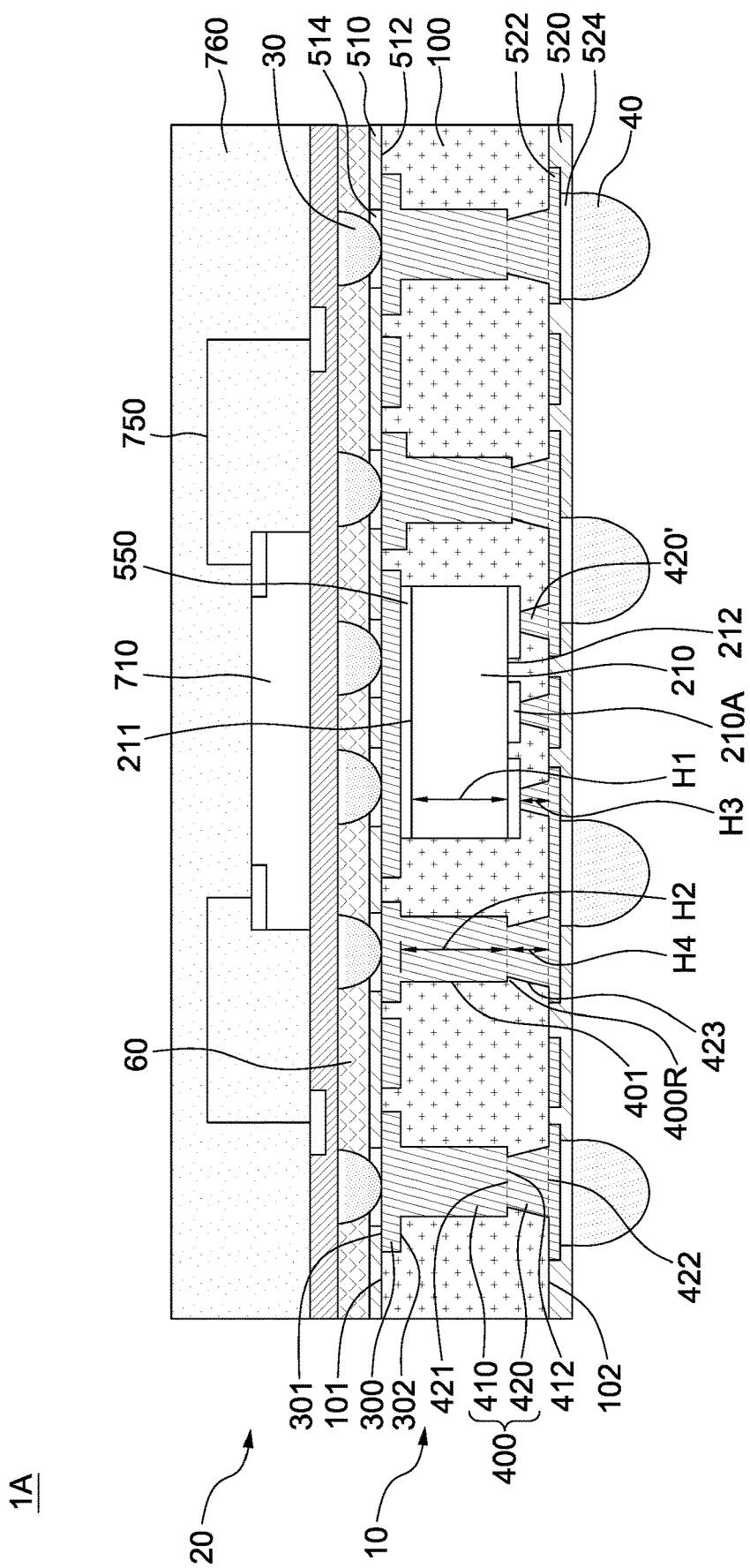
FIG. 1A illustrates a cross-sectional view of a semiconductor package structure 1A in accordance with some embodiments of the present disclosure.

FIG. 1A illustrates a cross-sectional view of a semiconductor package structure 1A in accordance with some embodiments of the present disclosure. The semiconductor package structure 1A is similar to the semiconductor package structure 1 in FIG. 1 except that, for example, the semiconductor package structure 1A further includes an underfill 60.

In some embodiments, the underfill 60 is between the package 10 and the package 20. In some embodiments, the underfill 60 covers the conductive elements 30. In some embodiments, the underfill 60 includes an epoxy resin, a molding compound (e.g., an epoxy molding compound or other molding compound), polyimide, a phenolic compound or material, a material including a silicone dispersed therein, or a combination thereof.

Figure 2:
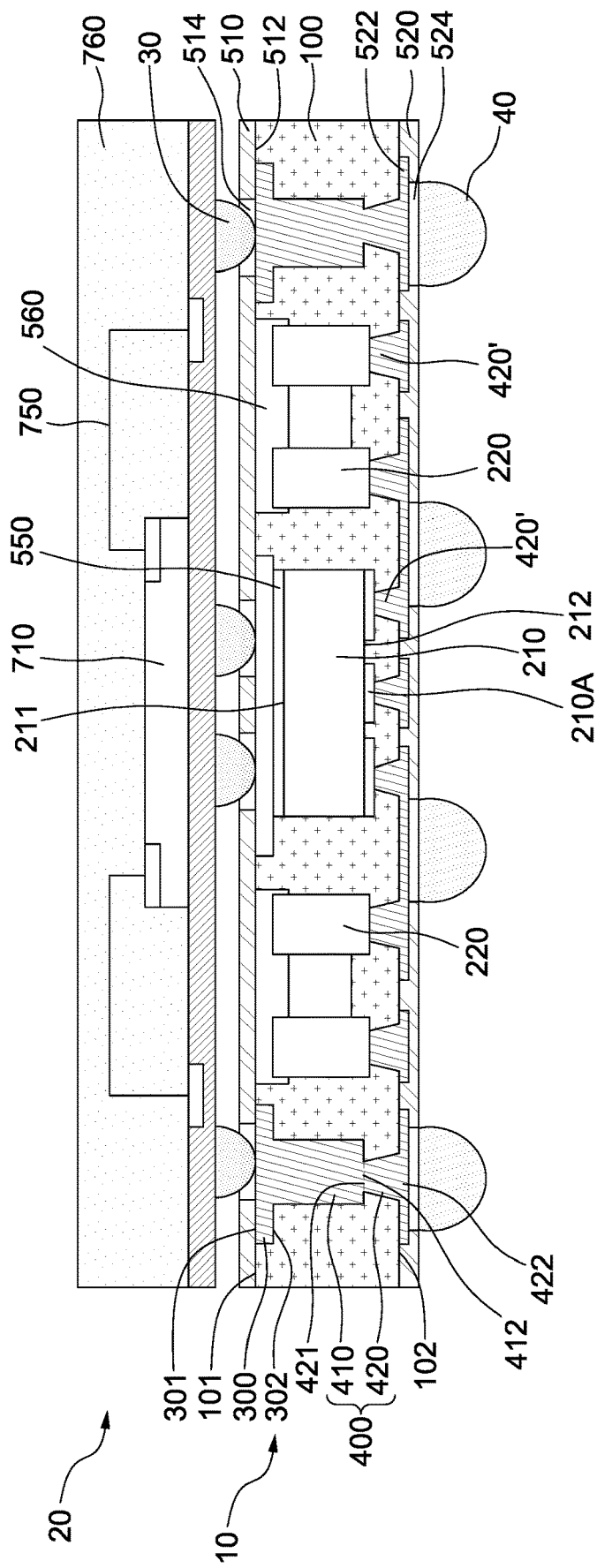
FIG. 2 illustrates a cross-sectional view of a semiconductor package structure in accordance with some embodiments of the present disclosure.

FIG. 2 illustrates a cross-sectional view of a semiconductor package structure 2 in accordance with some embodiments of the present disclosure. The semiconductor package structure 2 is similar to the semiconductor package structure 1 in FIG. 1 except that, for example, the package 10 of the semiconductor package structure 2 further includes one or more electronic components 220.

In some embodiments, the electronic component 220 is embedded in the substrate 100. In some embodiments, the electronic components 210 and 220 are arranged side-by-side. In some embodiments, the electronic component 220 is electrically to the conductive layer 522 through the conductive structure 420' (or the conductive via). In some embodiments, the electronic component 220 is electrically connected to the electronic component 210 through the conductive structure 420', the conductive layer 522, and the conductive structure 420' under the electronic component 210. In some embodiments, the electronic component 220 is spaced apart from the trace layer 300. In some embodiments, one end of the electronic component 220 is connected to the conductive structure 420', and the other end of the electronic component 220 opposite to the conductive structure 420' is connected to an adhesive layer 560 (e.g., a DAF). In some embodiments, the electronic component 220 may include one or more passive devices such resistors, capacitors, inductors, or a combination thereof.

Figure 3:
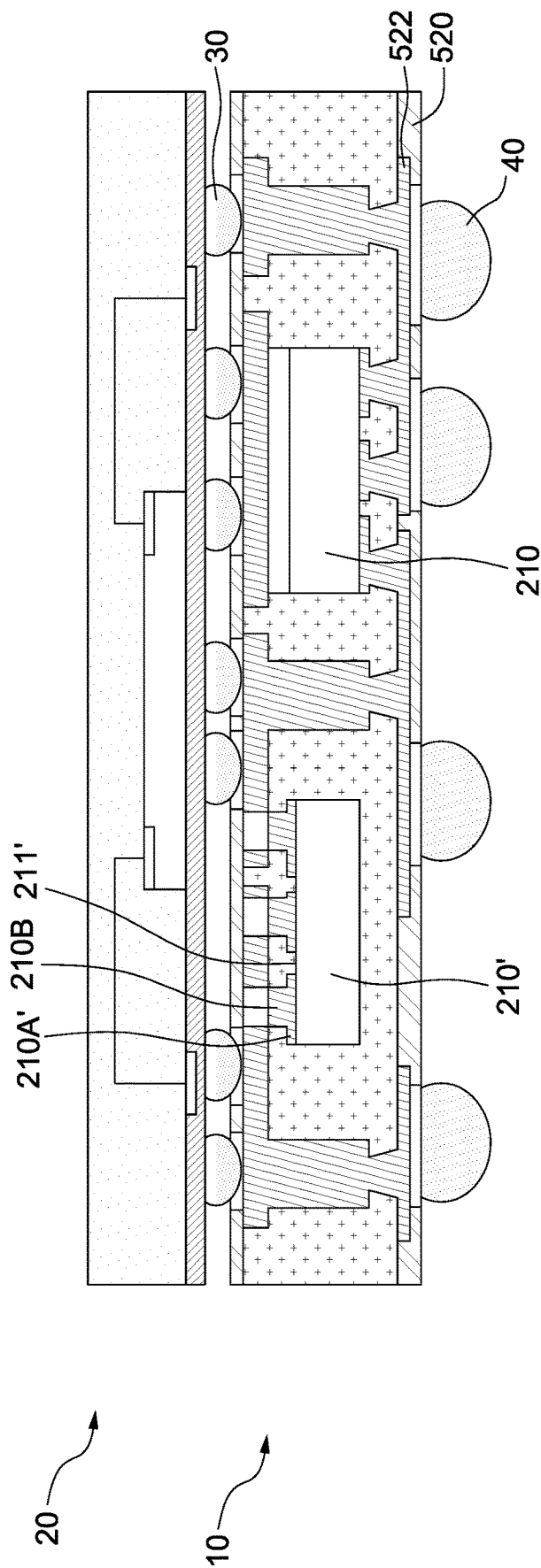
FIG. 3 illustrates a cross-sectional view of a semiconductor package structure in accordance with some embodiments of the present disclosure.

FIG. 3 illustrates a cross-sectional view of a semiconductor package structure 3 in accordance with some embodiments of the present disclosure. The semiconductor package structure 3 is similar to the semiconductor package structure 1 in FIG. 1 except that, for example, the package 10 of the semiconductor package structure 3 further includes one or more electronic components 210'.

In some embodiments, the electronic component 210' is embedded in the substrate 100. In some embodiments, the electronic components 210 and 210' are arranged side-by-side. In some embodiments, the electronic component 210' has an active surface 211' facing the trace layer 300. In some embodiments, the active surface 212 of the electronic component 210 and the active surface 211' of the electronic component 210' face opposite directions. In some embodiments, the electronic component 210' is electrically connected to the trace layer 300 through pads 210A' and conductive elements 210B. In some embodiments, the conductive element 210B may include a conductive bump (or a stub bump). In some embodiments, the electronic component 210' is spaced apart from the dielectric layer 520 and the conductive layer 522 by a portion of the dielectric layer (or the substrate 100). In some embodiments, the description of the electronic component 210' is similar to those of the electronic component 210 and thus is omitted hereinafter.

Figure 4:
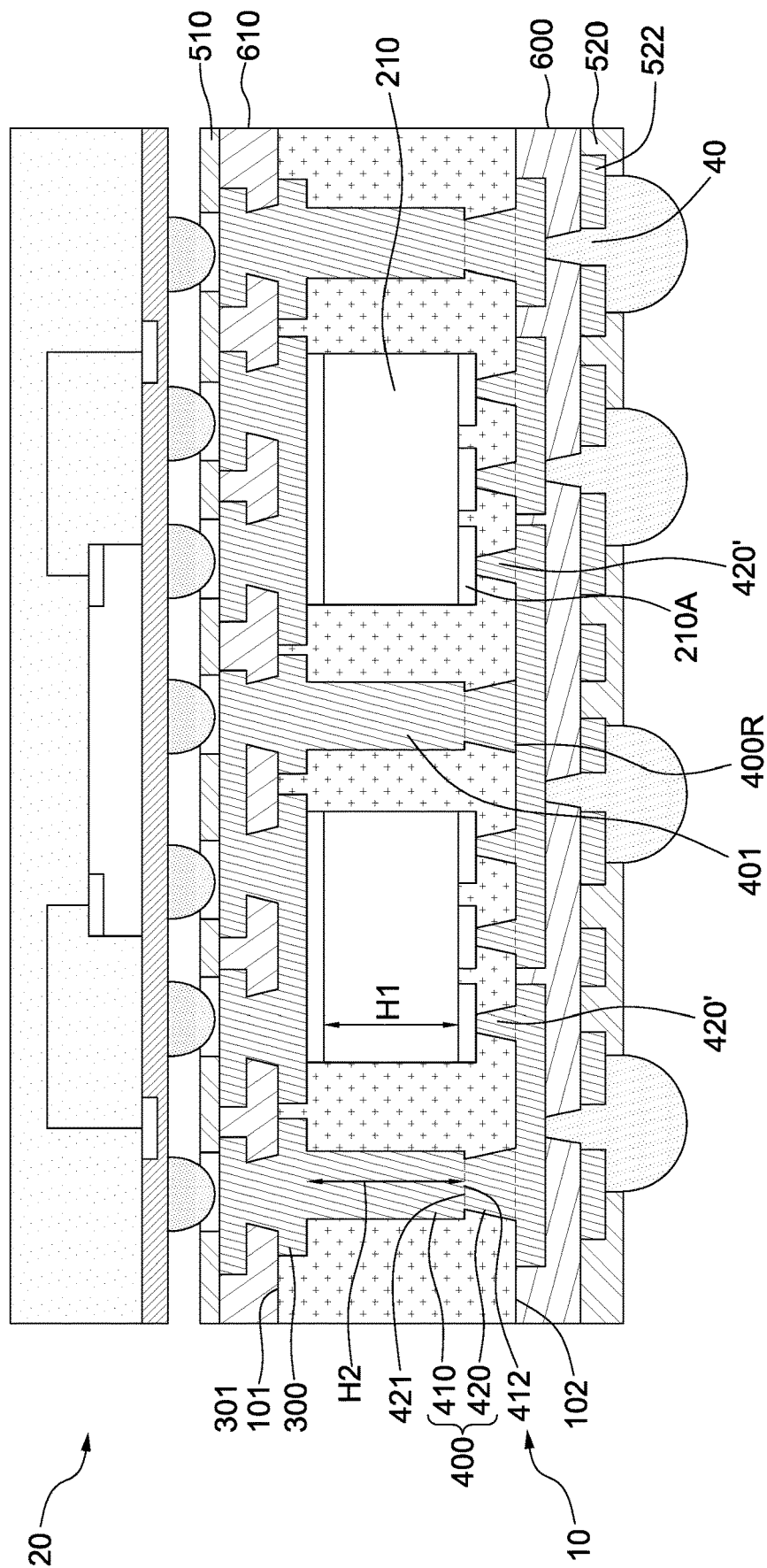
FIG. 4 illustrates a cross-sectional view of a semiconductor package structure in accordance with some embodiments of the present disclosure.

FIG. 4 illustrates a cross-sectional view of a semiconductor package structure 4 in accordance with some embodiments of the present disclosure. The semiconductor package structure 4 is similar to the semiconductor package structure 1 in FIG. 1, except that, for example, the package 10 of the semiconductor package structure 4 further includes interconnection layers 600 and 610.

In some embodiments, the interconnection layer 600 is on the surface 102 of the substrate 100. In some embodiments, the interconnection layer 600 is between the electrical contact 40 and the substrate 100. In some embodiments, the interconnection layer 600 is electrically connected to the electrical contact 40. In some embodiments, the conductive structure 400 connects the trace layer 300 to the interconnection layer 600. In some embodiments, the interconnection layer 600 may be or include a redistribution layer. In some embodiments, the conductive structure 420' connecting the electronic component 210 to the interconnection layer 600. In some embodiments, the conductive structure 420' connects the pad 210A of the electronic component 210 to the interconnection layer 600. In some embodiments, the pad 210A of the electronic component 210 is electrically connected to the electrical contact 40 through the conductive structure 420' and the interconnection layer (600).

In some embodiments, the interconnection layer 610 is on the surface 101 of the first substrate 100. In some embodiments, the interconnection layer 610 connects the package 20 to the package 10. In some embodiments, the interconnection layer 610 is electrically connected to the trace layer 300. In some embodiments, the interconnection layer 610 electrically connects the trace layer 300 to the conductive element 30. In some embodiments, the interconnection layer 610 includes a redistribution layer, an embedded trace layer, or a combination thereof. In some embodiments, the interconnection layer 610 includes a trace layer, and a conductive protection layer (e.g., a metal finish) is on the exposed surface of the trace layer. In some embodiments, the interconnection layer 600 is electrically connected to the interconnection layer 610 through the conductive structure 400.

Figure 5:
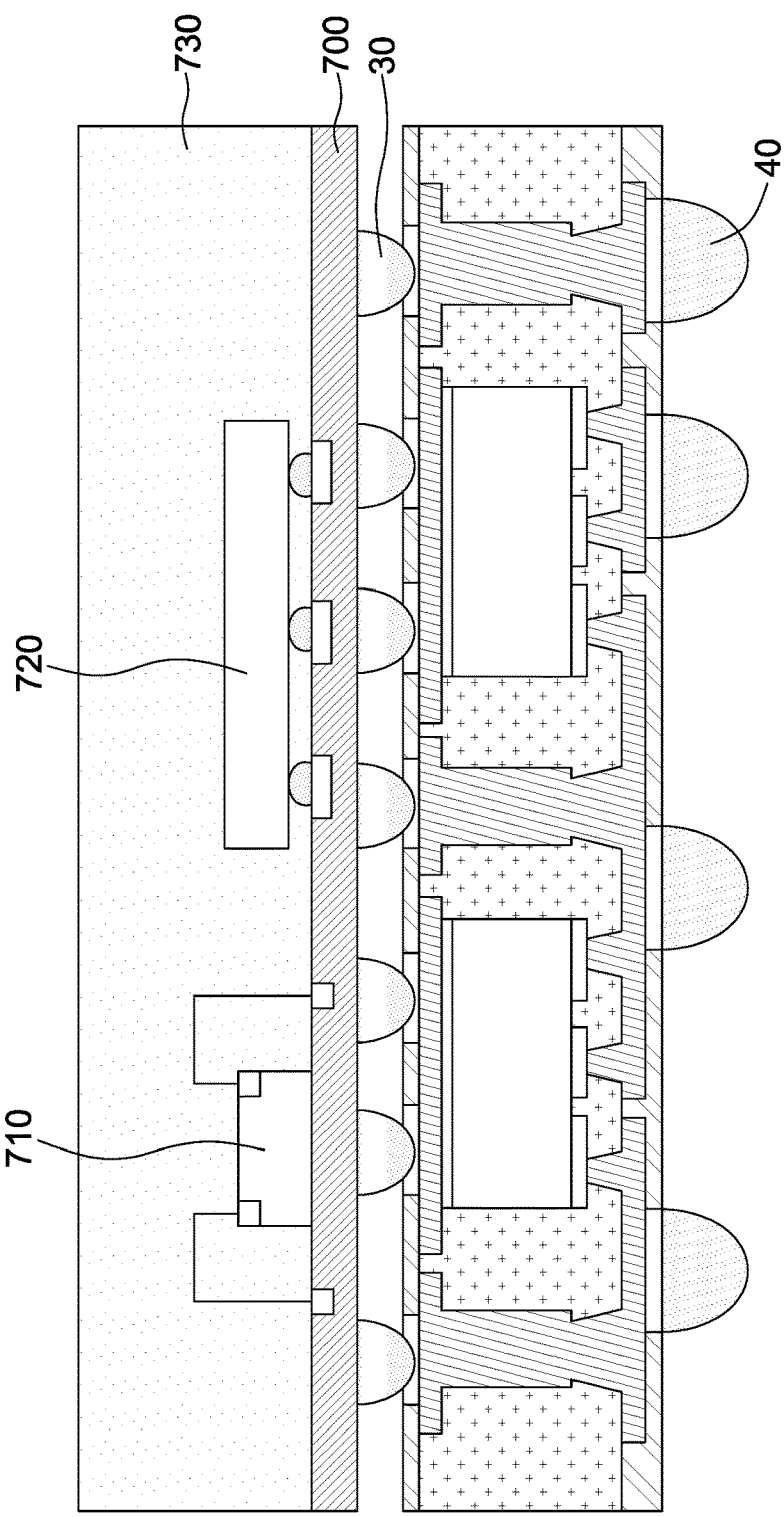
FIG. 5 illustrates a cross-sectional view of a semiconductor package structure in accordance with some embodiments of the present disclosure.

FIG. 5 illustrates a cross-sectional view of a semiconductor package structure 5 in accordance with some embodiments of the present disclosure. The semiconductor package structure 5 is similar to the semiconductor package structure 1 in FIG. 1, and the differences therebetween are described as follows.

In some embodiments, the package 10 includes a plurality of electronic components 210. In some embodiments, at least one of the conductive structures 400 is between the adjacent electronic components 210. The electronic components 210 are electrically connected to the electrical contacts 40 through the conductive structures 420' (or the conductive vias) and the conductive layer 522.

In some embodiments, the package 20 further includes an electronic component 720 and connection elements 730 bonding the electronic component 720 to the substrate 700. In some embodiments, the electronic component 710 is bonded to the substrate 700 by wire-bond technique, and the electronic component 720 is bonded to the substrate 700 by flip-chip technique. In some embodiments, the encapsulant 760 encapsulates the substrate 700, the electronic components 710 and 720, and the connection elements 730.

Figure 6A:
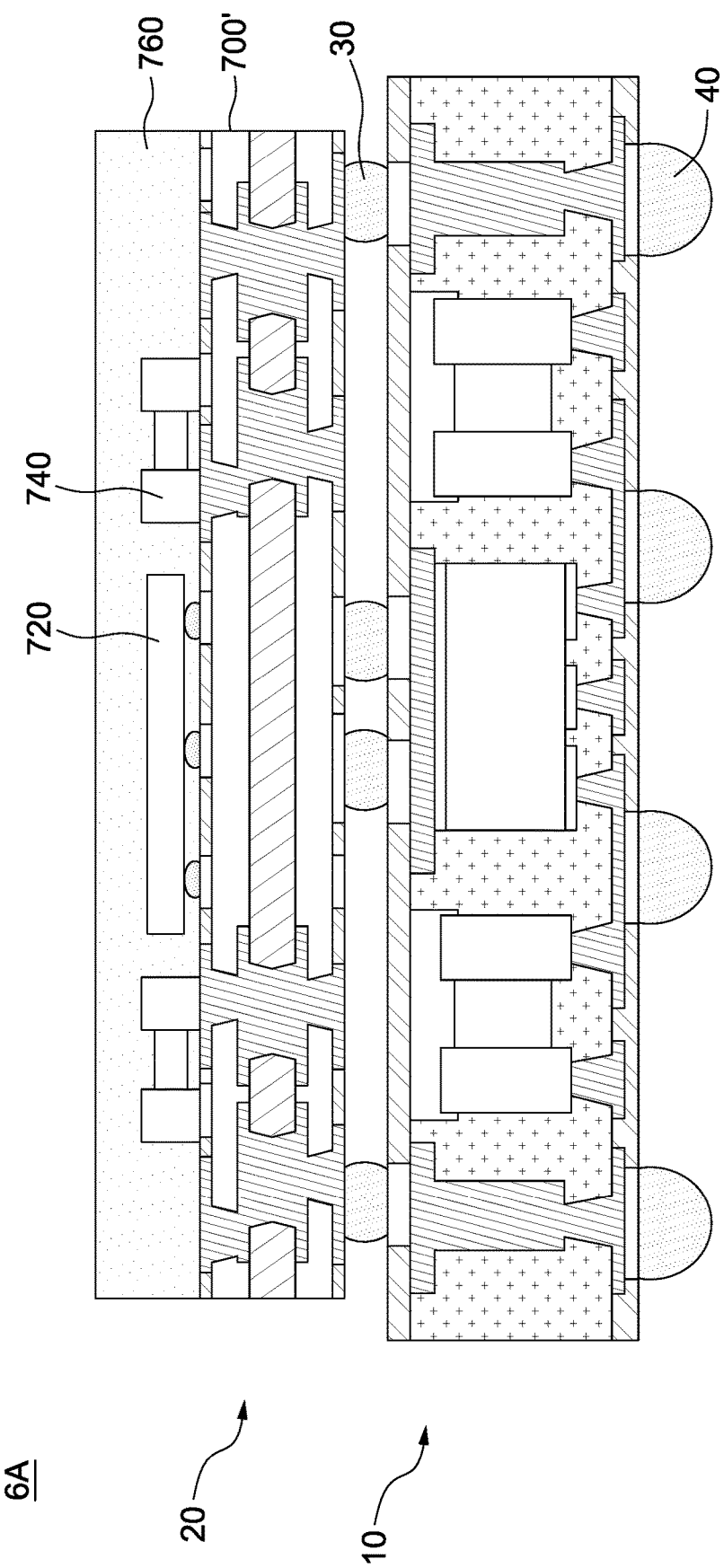
FIG. 6A illustrates a cross-sectional view of a semiconductor package structure in accordance with some embodiments of the present disclosure.

FIG. 6A illustrates a cross-sectional view of a semiconductor package structure 6A in accordance with some embodiments of the present disclosure. The semiconductor package structure 6A is similar to the semiconductor package structure 2 in FIG. 2, and the differences therebetween are described as follows.

In some embodiments, the package 20 further includes one or more electronic components 740 encapsulated by the encapsulant 760. In some embodiments, the electronic component 740 may include one or more passive devices such resistors, capacitors, inductors, or a combination thereof. In some embodiments, the substrate 700' includes an interconnection structure, such as a plurality of conductive traces, conductive pads, and through vias. In some embodiments, the electronic components 720 and 740 of the package 20 are electrically connected to the package 10 through the substrate 700 and the conductive elements 30.

Figure 6B:
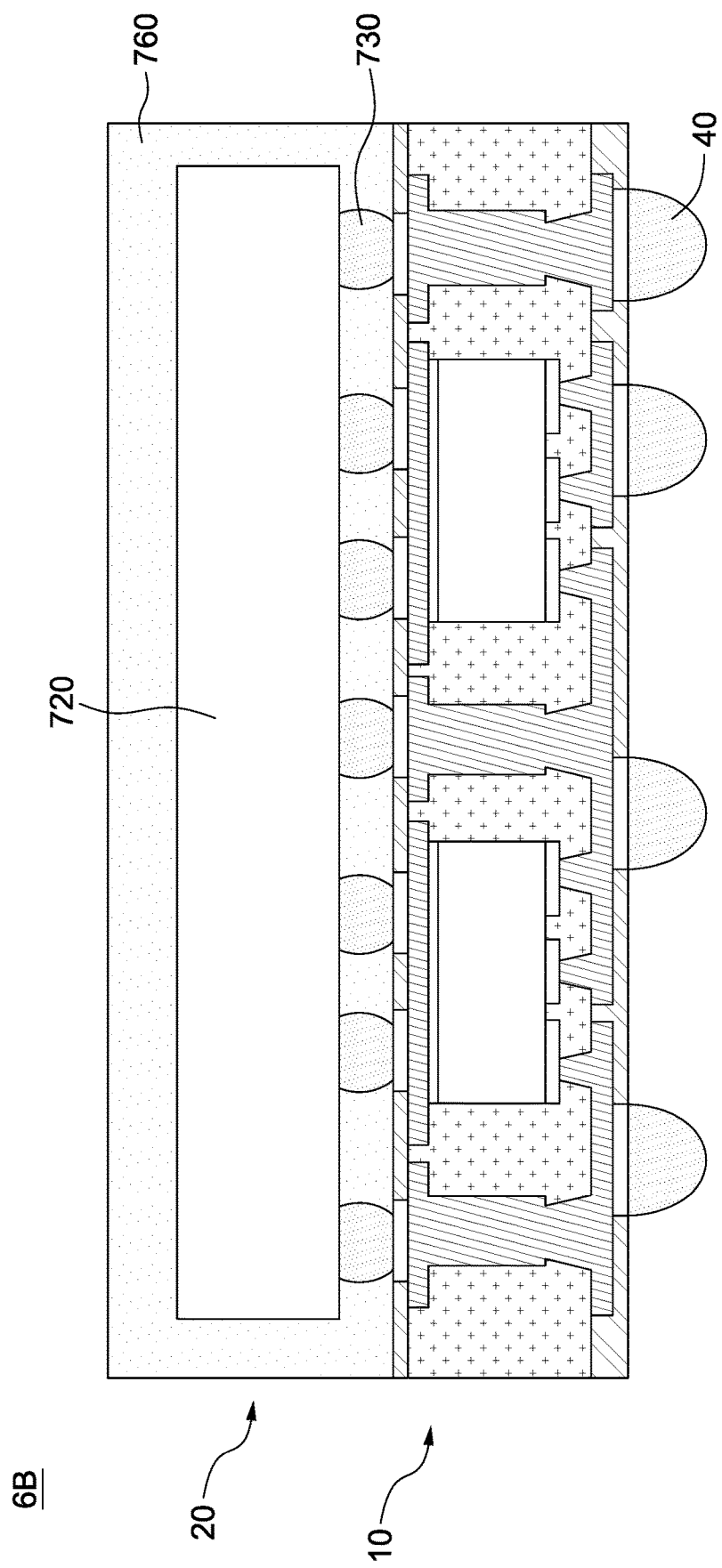
FIG. 6B illustrates a cross-sectional view of a semiconductor package structure in accordance with some embodiments of the present disclosure.

FIG. 6B illustrates a cross-sectional view of a semiconductor package structure 6B in accordance with some embodiments of the present disclosure. The semiconductor package structure 6B is similar to the semiconductor package structure 5 in FIG. 2, and the differences therebetween are described as follows.

In some embodiments, the electronic component 720 is bonded to the package 10 through the conductive elements 730 followed by encapsulating the electronic component 720 and the conductive elements 730 by the encapsulant 760. In some embodiments, the electronic component 720 is bonded to the package 10 by flip-chip technique. In some embodiments, the package 20 includes the electronic component 720, the conductive elements 730, and the encapsulant 760. In some embodiments, the package 20 directly bonds to the package 10.

Figure 6C:
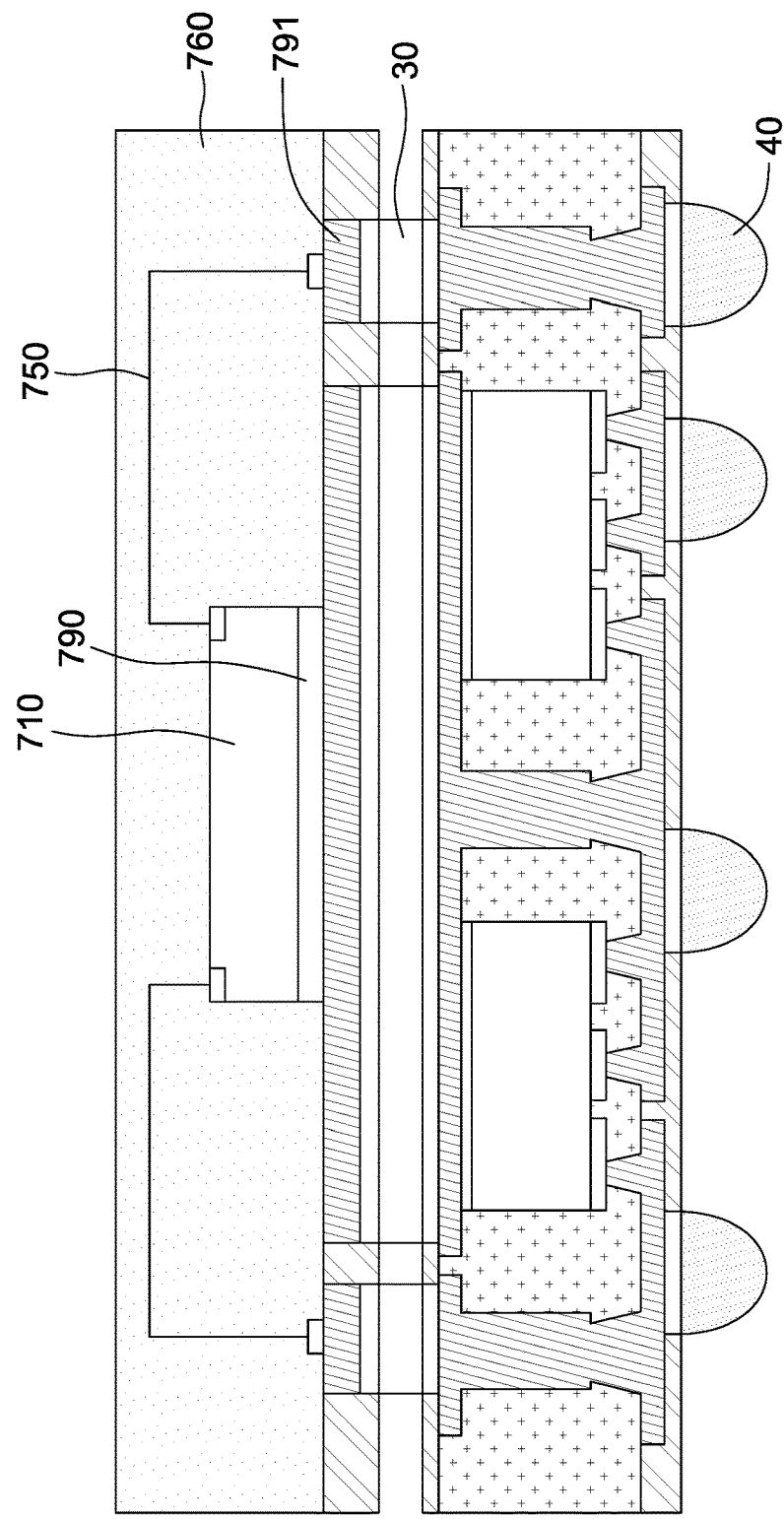
FIG. 6C illustrates a cross-sectional view of a semiconductor package structure in accordance with some embodiments of the present disclosure.

FIG. 6C illustrates a cross-sectional view of a semiconductor package structure 6C in accordance with some embodiments of the present disclosure. The semiconductor package structure 6C is similar to the semiconductor package structure 5 in FIG. 5 except that, for example, the package 20 is a quad flat no lead (QFN) package bonded to the package 10 through the conductive elements 30.

In some embodiments, the electronic component 710 is adhered to the package 10 through an adhesive layer 790. In some embodiments, the electronic component 710 is bonded to the package 10 through the bonding wires 750 followed by encapsulating the electronic component 710 and the bonding wires 750 by the encapsulant 760. In some embodiments, the electronic component 710 is bonded to a leadframe 791 by wire-bond technique.

Figure 6D:
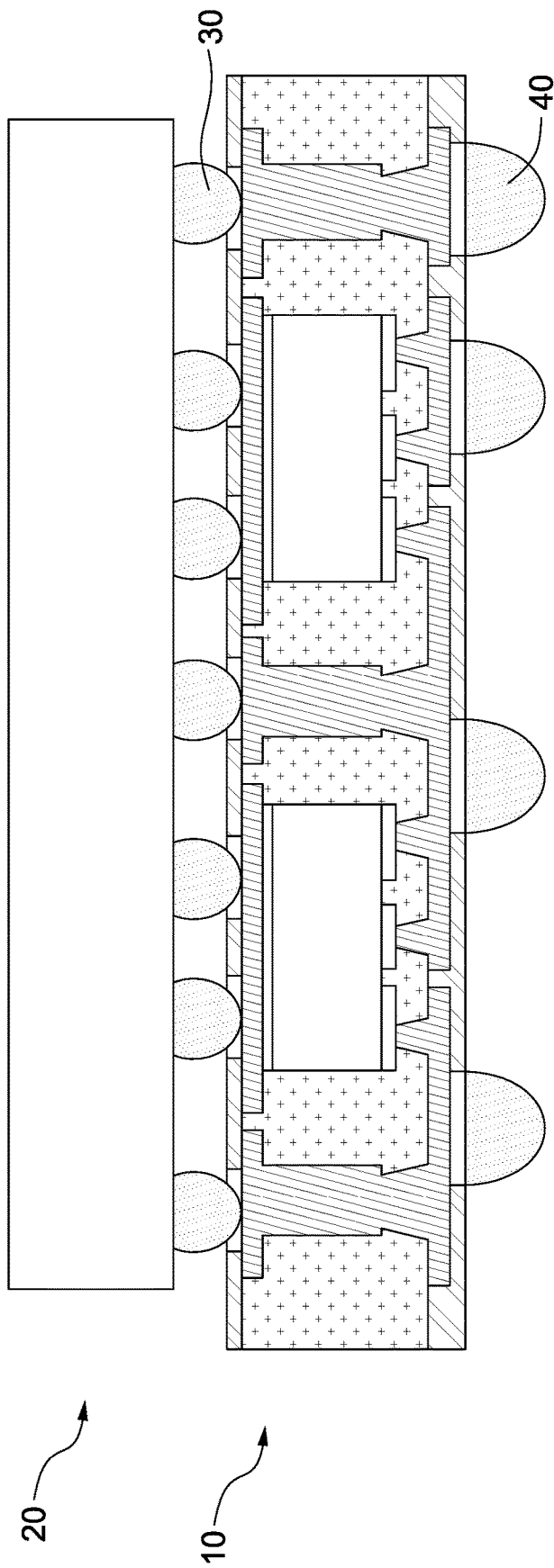
FIG. 6D illustrates a cross-sectional view of a semiconductor package structure in accordance with some embodiments of the present disclosure.

FIG. 6D illustrates a cross-sectional view of a semiconductor package structure 6D in accordance with some embodiments of the present disclosure. The semiconductor package structure 6D is similar to the semiconductor package structure 5 in FIG. 5 except that, for example, the package 20 is a wafer-level chip scale package (WLCSP) bonded to the package 10 through the conductive elements 30 (e.g., conductive bumps).

Figure 6E:
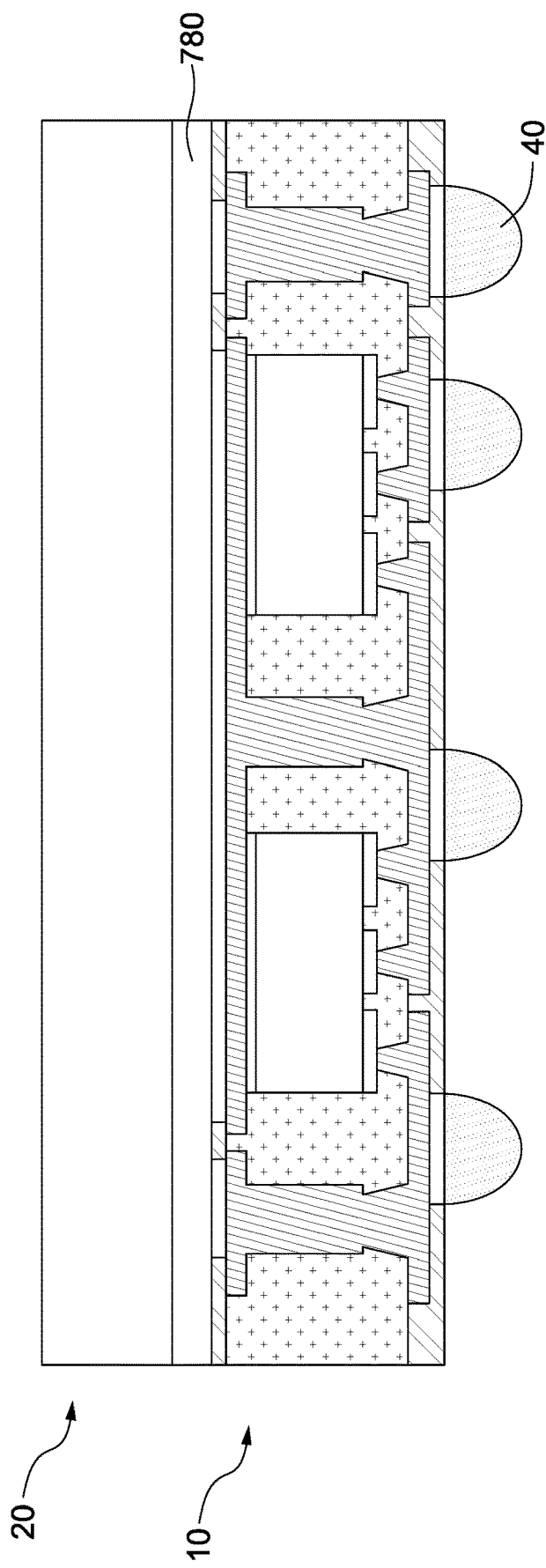
FIG. 6E illustrates a cross-sectional view of a semiconductor package structure in accordance with some embodiments of the present disclosure.

FIG. 6E illustrates a cross-sectional view of a semiconductor package structure 6E in accordance with some embodiments of the present disclosure. The semiconductor package structure 6E is similar to the semiconductor package structure 5 in FIG. 5 except that, for example, the package 20 includes a heat sink bonded to the package 10 through an adhesive layer 780.

Figure 6F:
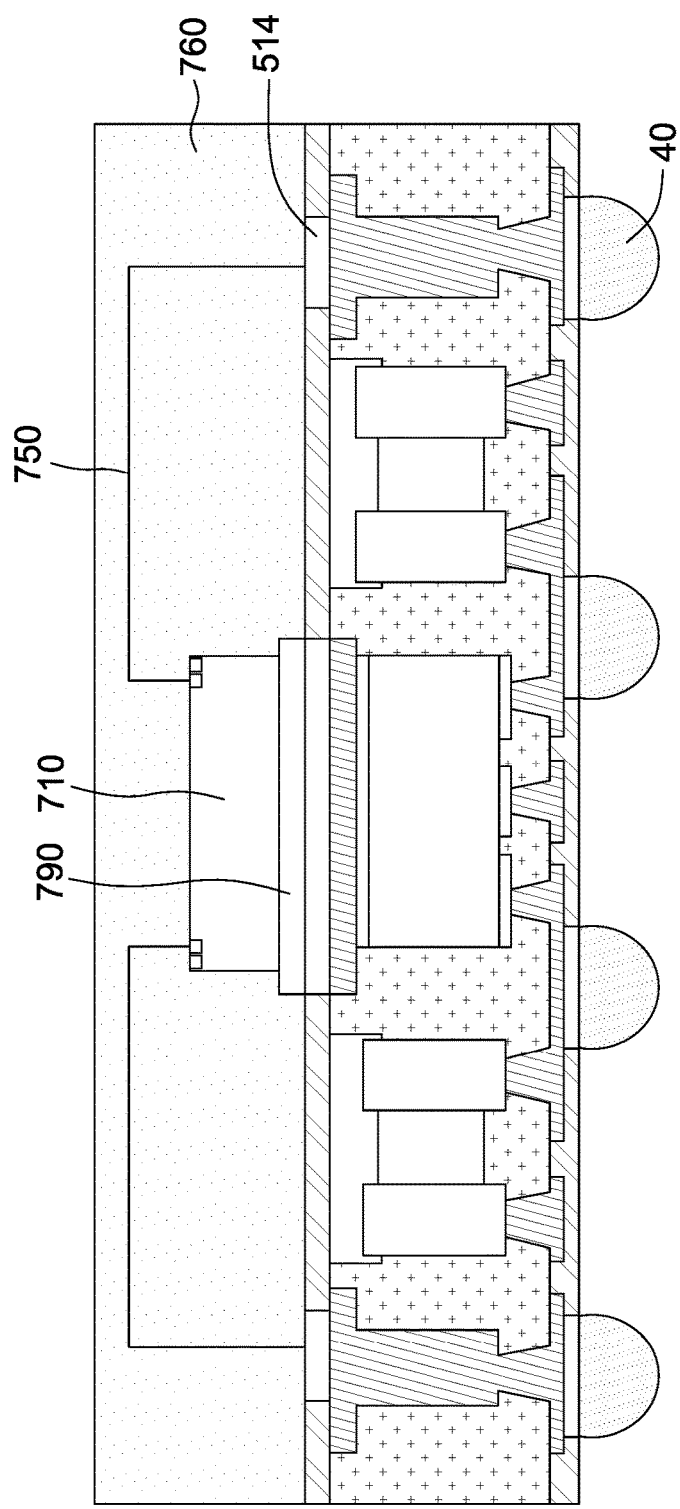
FIG. 6F illustrates a cross-sectional view of a semiconductor package structure in accordance with some embodiments of the present disclosure.

FIG. 6F illustrates a cross-sectional view of a semiconductor package structure 6F in accordance with some embodiments of the present disclosure. The semiconductor package structure 6F is similar to the semiconductor package structure 2 in FIG. 2, and the differences therebetween are described as follows.

In some embodiments, the electronic component 710 is adhered to the package 10 through an adhesive layer 790. In some embodiments, the electronic component 710 is bonded to the package 10 through the bonding wires 750 followed by encapsulating the electronic component 710 and the bonding wires 750 by the encapsulant 760. In some embodiments, the electronic component 710 is bonded to the package 10 by wire-bond technique. In some embodiments, the package 20 includes the electronic component 710, the bonding wires 750, the encapsulant 760, and the adhesive layer 790. In some embodiments, the package 20 directly bonds to the package 10.

Figure 6G:
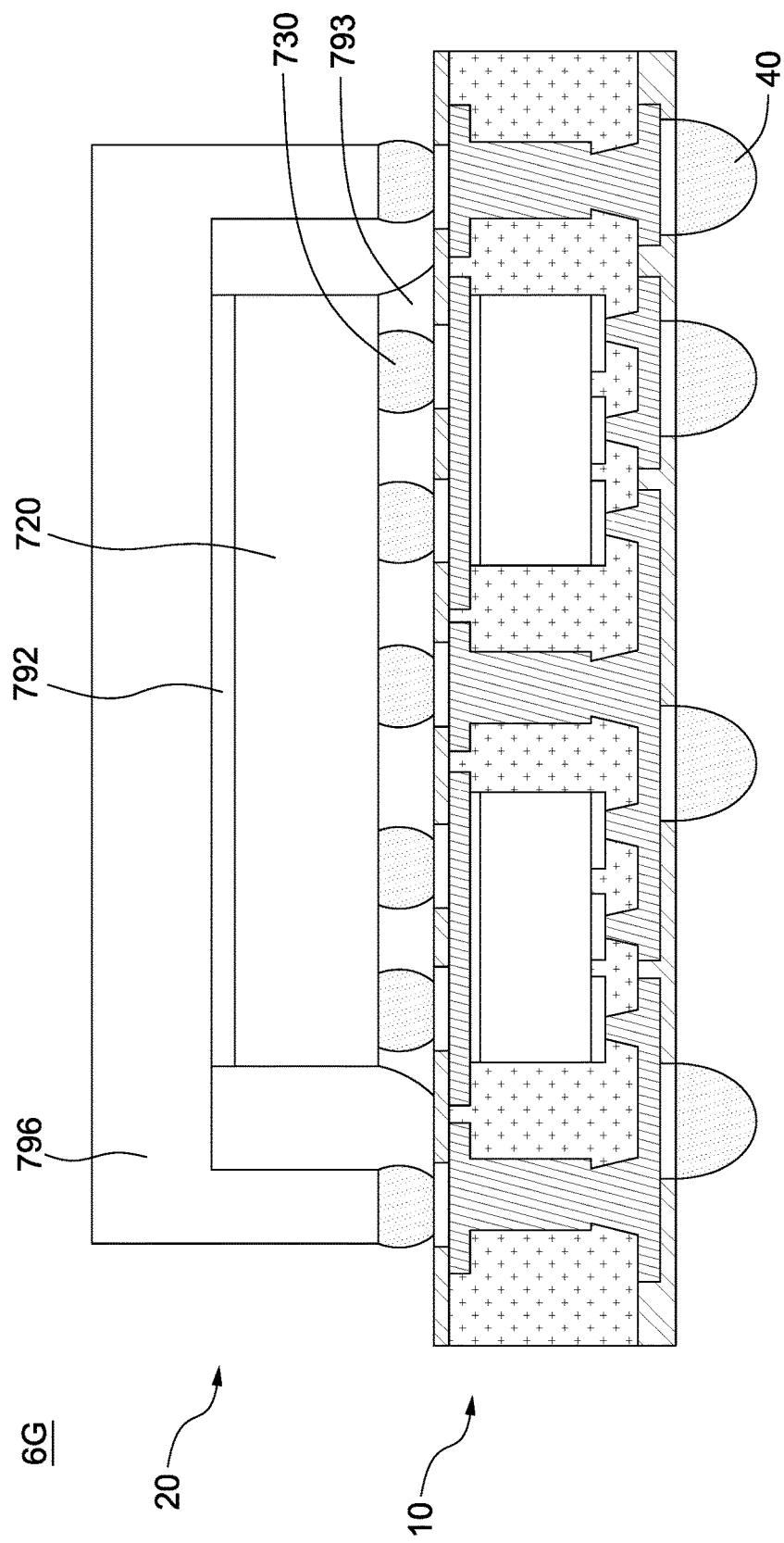
FIG. 6G illustrates a cross-sectional view of a semiconductor package structure in accordance with some embodiments of the present disclosure.

FIG. 6G illustrates a cross-sectional view of a semiconductor package structure 6G in accordance with some embodiments of the present disclosure. The semiconductor package structure 6G is similar to the semiconductor package structure 5 in FIG. 5, and the differences therebetween are described as follows.

In some embodiments, the package 20 includes a heat sink 796 bonded to the package 10. In some embodiments, the electronic component 720 is connected to the package 10 through conductive elements 730 (e.g., conductive bumps) covered by an underfill 793. In some embodiments, the electronic component 720 is adhered to the heat sink 796 through an adhesive layer 792.

Figure 6H:
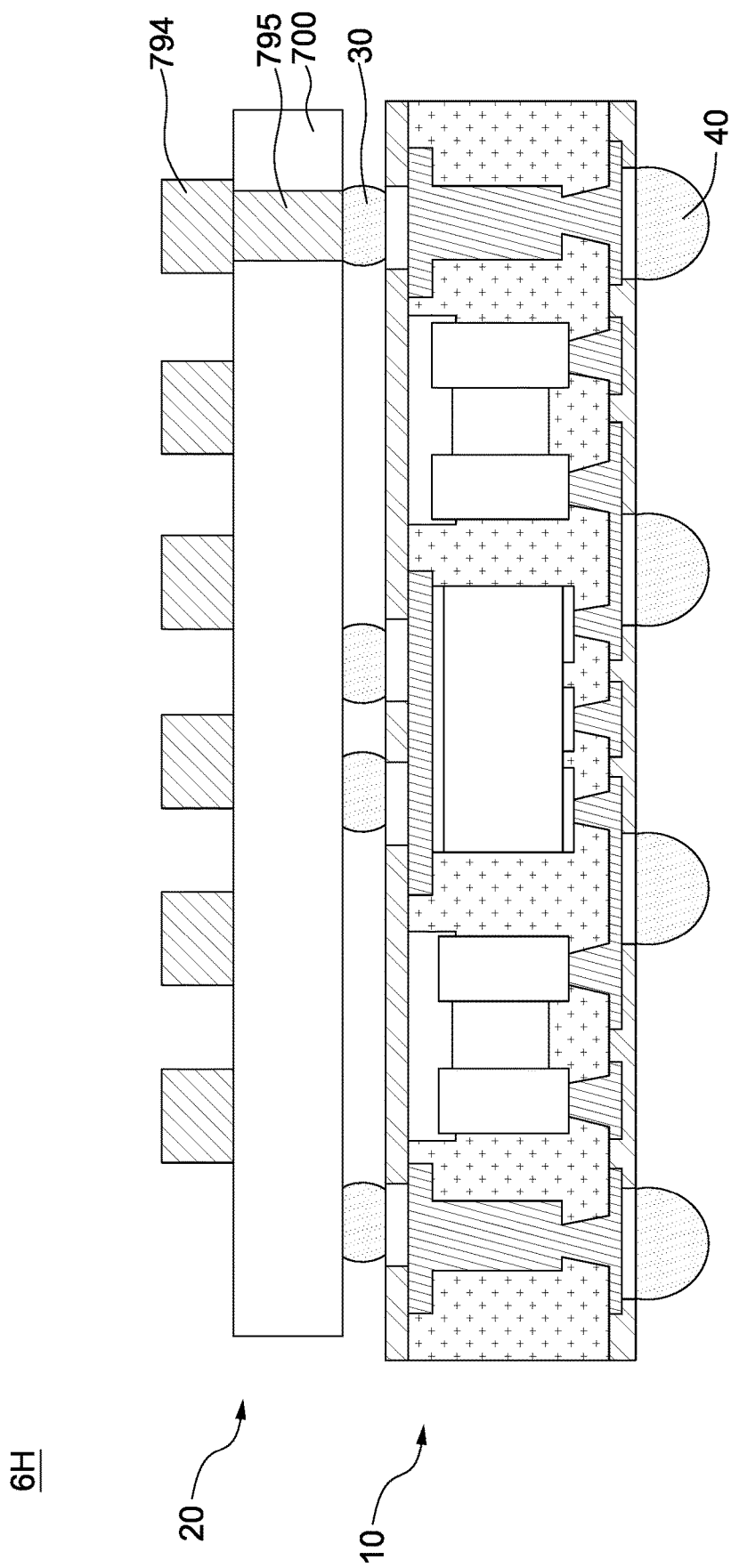
FIG. 6H illustrates a cross-sectional view of a semiconductor package structure in accordance with some embodiments of the present disclosure.

FIG. 6H illustrates a cross-sectional view of a semiconductor package structure 6H in accordance with some embodiments of the present disclosure. The semiconductor package structure 6H is similar to the semiconductor package structure 2 in FIG. 2 except that, for example, the package 20 includes an antenna pattern 794 electrically connected to the package 10 through a conductive element 795 passing through the substrate 700.

Figure 6I:
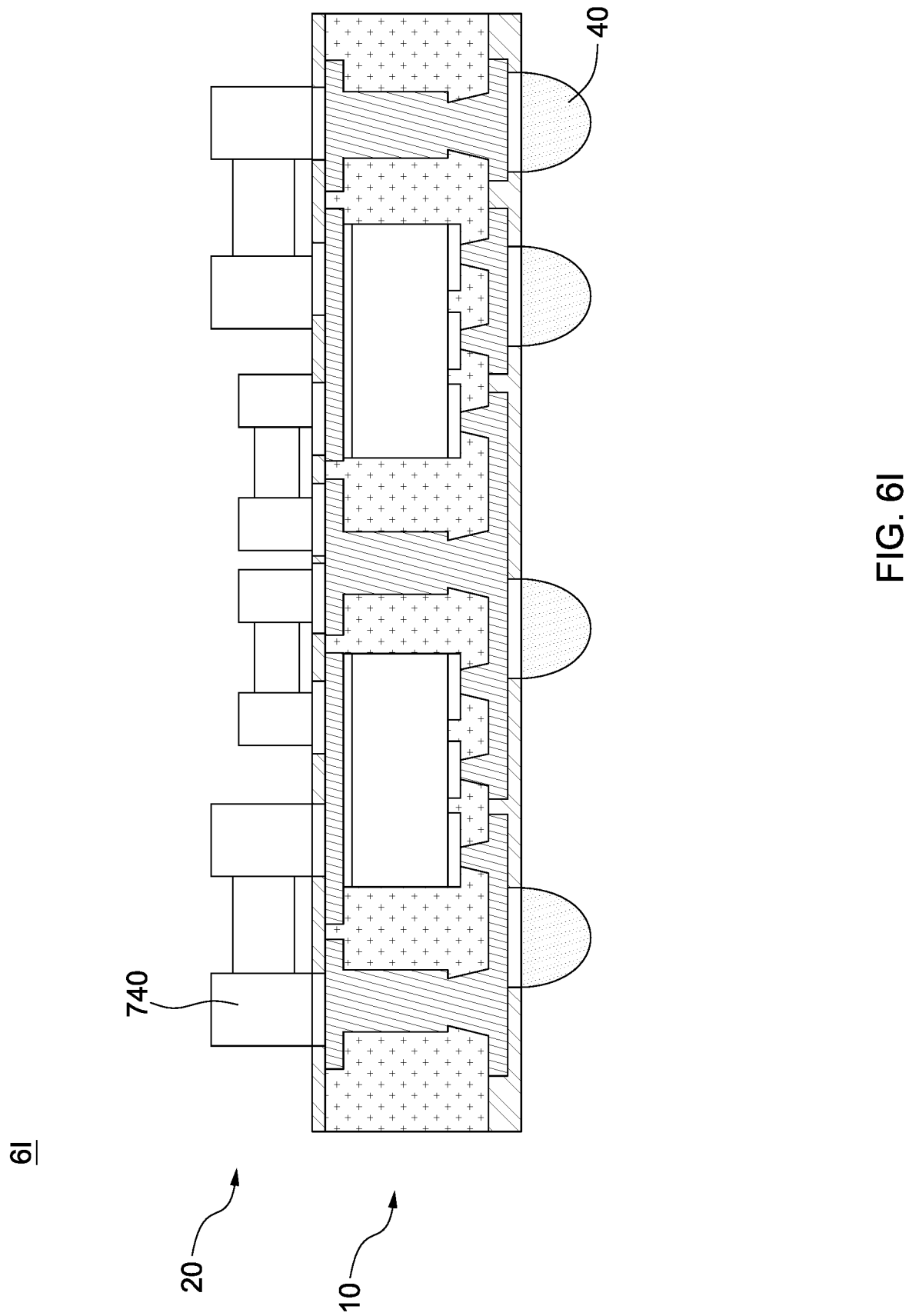
FIG. 6I illustrates a cross-sectional view of a semiconductor package structure in accordance with some embodiments of the present disclosure.

FIG. 6I illustrates a cross-sectional view of a semiconductor package structure 6I in accordance with some embodiments of the present disclosure. The semiconductor package structure 6I is similar to the semiconductor package structure 5 in FIG. 5 except that, for example, the package 20 includes one or more electronic components 740 directly bonded to the package 10.

FIG. 7A, FIG. 7B, FIG. 7C, FIG. 7D, FIG. 7E, FIG. 7F, and FIG. 7G illustrate various operations in a method of manufacturing a semiconductor package structure 2 in accordance with some embodiments of the present disclosure.

Figure 7A:
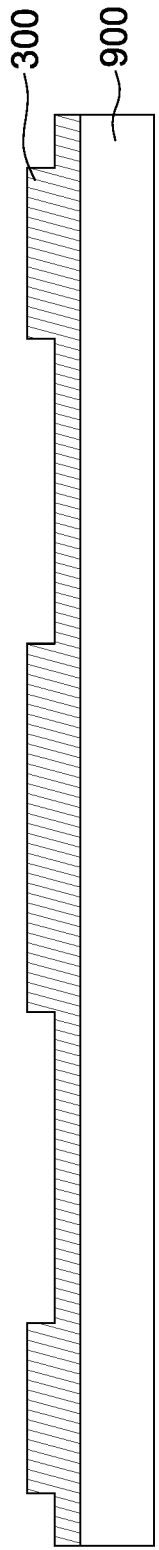
FIG. 7A, FIG. 7B, FIG. 7C, FIG. 7D, FIG. 7E, FIG. 7F, and FIG. 7G illustrate various operations in a method of manufacturing a semiconductor package structure in accordance with some embodiments of the present disclosure.

Referring to FIG. 7A, a trace layer 300 is formed on a carrier 900. In some embodiments, the trace layer 300 may be a patterned metal layer. In some embodiments, a metal layer may be formed on the carrier 900, and an etching process may be performed on the metal layer to form the patterned metal layer on the carrier 900.

Figure 7B:
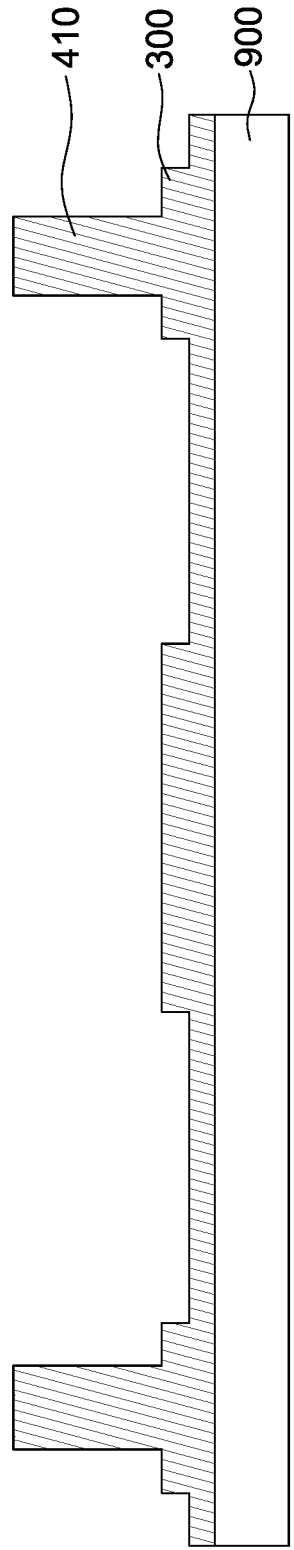

Referring to FIG. 7B, one or more conductive pillars 410 are formed on a surface 302 of the trace layer 300.

Figure 7C:
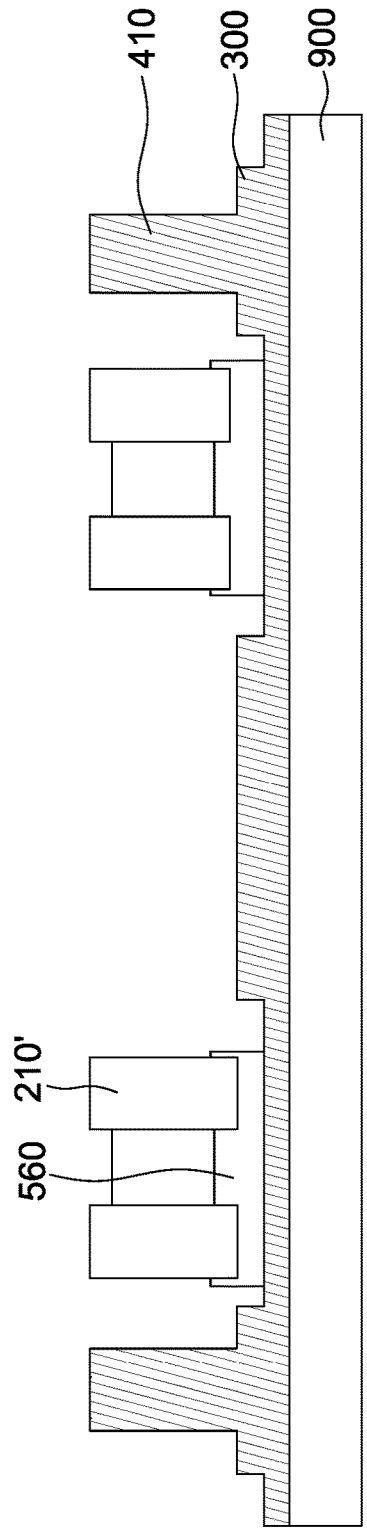

Referring to FIG. 7C, one or more electronic component 210' are provided. In some embodiments, the electronic component 210' is disposed on the carrier 900. In some embodiments, the electronic component 210' is adhered to the carrier 900 through an adhesive layer 560.

Figure 7D:
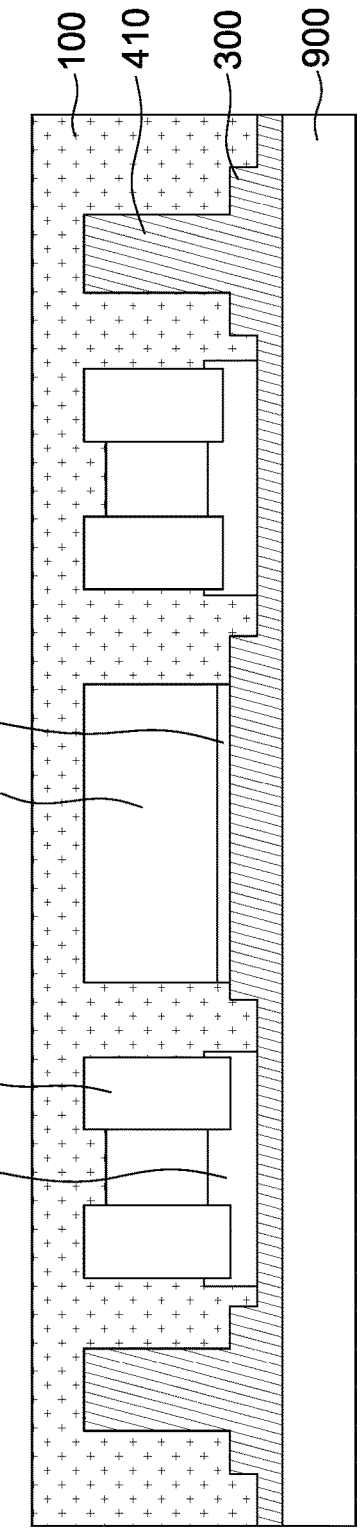

Referring to FIG. 7D, an electronic component 210 is disposed on the carrier 900, and a dielectric layer 100 is formed to cover the trace layer 300, the conductive pillar 410, and the electronic components 210 and 210'. In some embodiments, the electronic component 210 is disposed on the surface 302 of the trace layer 300.

Figure 7E:
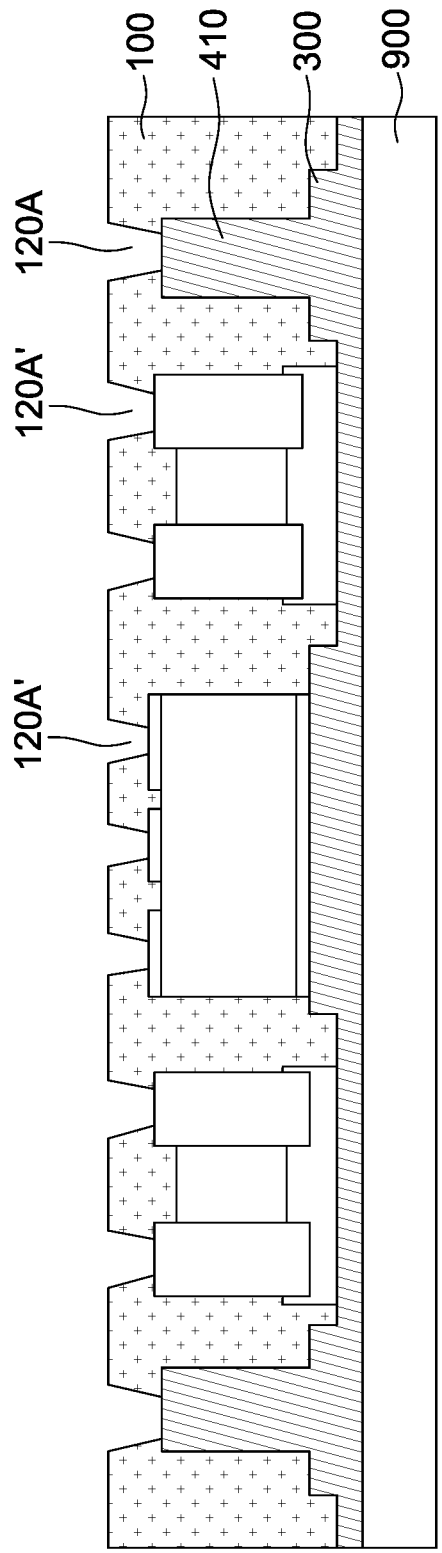

Referring to FIG. 7E, one or more through vias 120A and 120A' are formed in the dielectric layer 100 exposing one or more portions of the conductive pillars 410. In some embodiments, the through vias 120A expose portions of upper surfaces of the conductive pillars 410. In some embodiments, the through vias 120A' expose portions of upper surfaces of the electronic components 210 and 210'.

Figure 7F:
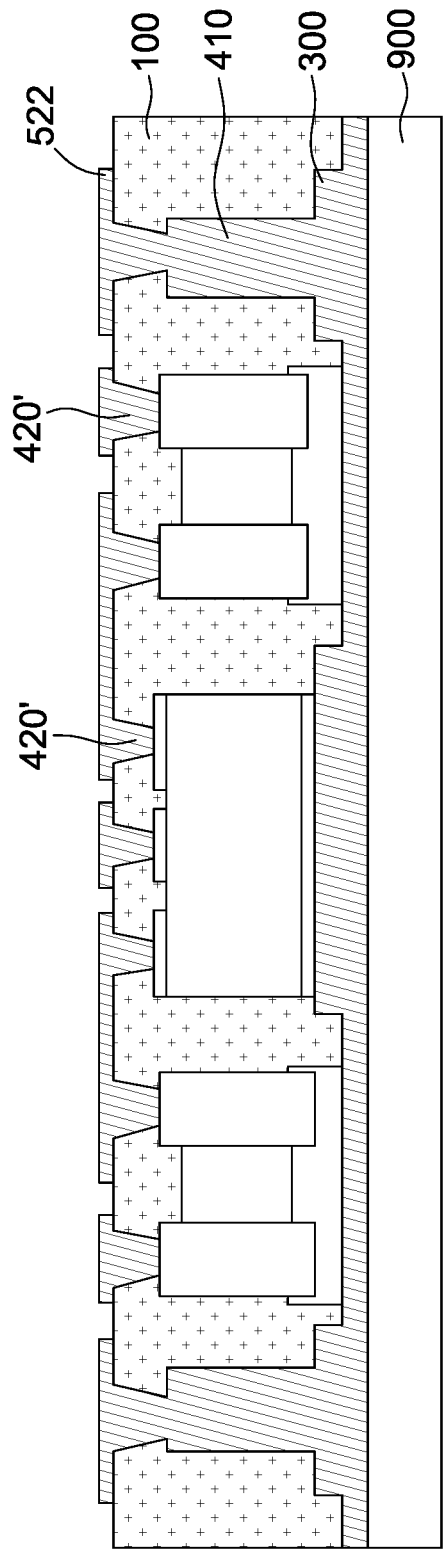

Referring to FIG. 7F, one or more conductive vias 420 and 420' are formed within the through vias 120A and 120A' in the dielectric layer (or the substrate 100). In some embodiments, a conductive material may be formed to fill in the through vias 120A and 120A' as well as on the upper surface of the dielectric layer (or the substrate 100), so as to form the conductive vias 420 on the conductive pillars 410 and conductive vias 420' on the electronic components 210 and 210'. In some embodiments, portions of the conductive material on the upper surface of the dielectric layer (or the substrate 100) may be patterned to form a conductive layer 522.

Figure 7G:
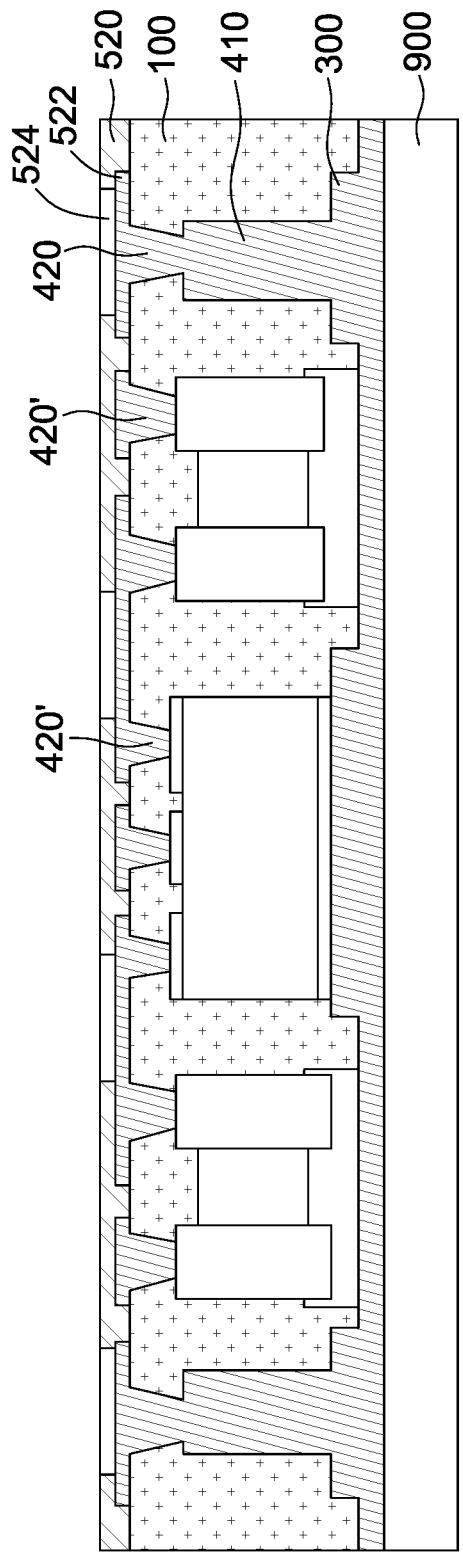

Referring to FIG. 7G, a dielectric layer 520 is formed over the substrate 100 and the conductive layer 522 to fully expose or to expose at least a portion of the conductive layer 522 for electrical connections. In some embodiments, the dielectric layer 520 includes a solder mask or a solder resist. In some embodiments, a conductive protection layer 524 (e.g., a metal finish) is formed on the surfaces of the exposed portions of the conductive layer 522.

Referring to FIG. 2, the carrier 900 is removed to expose a surface 301 opposite to the surface 302 of the trace layer 300. In some embodiments, a thinning operation may be performed on the trace layer 300 to remove portions of the trace layer 300 to expose the surface 301. In some embodiments, a dielectric layer 510 is formed over the substrate 100 and the trace layer 300 to fully expose or to expose at least a portion of the trace layer 300 for electrical connections. In some embodiments, the dielectric layer 510 includes a solder mask or a solder resist. In some embodiments, a conductive protection layer 514 (e.g., a metal finish) is formed on the surfaces of the exposed portions of the trace layer 300.

Referring to FIG. 2, a package 20 is disposed on a surface 301 of the trace layer 300, and electrical contacts 40 are formed on a surface 102 of the substrate 100. As such, the semiconductor package structure 2 illustrated in FIG. 2 is formed.

In some other embodiments, instead of a carrier 900 is provided as illustrated in FIG. 7A, a metal layer is provided, and a trace layer 300 may be formed on a first surface of the metal layer. After operations illustrated in FIGS. 7B to 7G are performed, instead of removing the carrier 900, a thinning operation may be performed on a second surface opposite to the first surface of the metal layer to expose the surface 301 of the trace layer 300. Next, a package 20 may be bonded to the as-formed package 10 to form the semiconductor package structure 2 illustrated in FIG. 2

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   a first package, comprising:
      a first substrate having a first surface and a second surface opposite to the first surface;
      an electronic component embedded in the first substrate;
      a trace layer having an uppermost conductive layer embedded in the first substrate and exposed from the first surface of the first substrate, wherein the trace layer comprises a first portion within a vertical projection area of the electronic component and a second portion outside of the vertical projection area of the electronic component;
      a first conductive structure embedded in the first substrate and connecting the second portion of the trace layer to the second surface of the first substrate; and
      a dielectric layer contacting the first surface of the first substrate and exposing the first portion of the trace layer,
   wherein the dielectric layer has an opening exposing the first portion of the trace layer, and the semiconductor package structure further comprises a solder extending into the opening.

2. A semiconductor package structure, comprising:
   a first package, comprising:
      a first substrate having a first surface and a second surface opposite to the first surface;
      an electronic component embedded in the first substrate;
      a trace layer having an uppermost conductive layer embedded in the first substrate and exposed from the first surface of the first substrate, wherein the trace layer comprises a first portion within a vertical projection area of the electronic component and a second portion outside of the vertical projection area of the electronic component; and
      a first conductive structure embedded in the first substrate and connecting the second portion of the trace layer to the second surface of the first substrate,
   wherein the first conductive structure comprises a pillar connected to the second portion of the trace layer, and a central axis of the pillar is misaligned with a central axis of the second portion of the trace layer in a vertical direction.

3. The semiconductor package structure of claim 2, wherein the first substrate comprises a first portion between the first portion of the trace layer and the second portion of the trace layer.

4. The semiconductor package structure of claim 3, wherein the trace layer further comprises a third portion outside of the vertical projection area of the electronic component, and wherein in a cross-sectional view perspective, the third portion of the trace layer is spaced apart from the second portion of the trace layer and the first portion of the trace layer, and a width of the third portion of the trace layer is less than a width of the second portion of the trace layer.

5. The semiconductor package structure of claim 4, wherein the third portion of the trace layer has a first surface and a second surface opposite to the first surface, the first surface of the third portion of the trace layer is substantially aligned with the first surface of the first substrate, and the first substrate further comprises a second portion contacting the entire second surface of the third portion of the trace layer.

6. The semiconductor package structure of claim 4, wherein the third portion of the trace layer is spaced apart from the second portion of the trace layer by a second portion of the first substrate.

7. The semiconductor package structure of claim 4, wherein there is free of any solder over the third portion of the trace layer.

8. The semiconductor package structure of claim 2, further comprising a dielectric layer contacting the first surface of the first substrate and exposing the first portion of the trace layer.

9. The semiconductor package structure of claim 8, wherein the trace layer further comprises a third portion outside of the vertical projection area of the electronic component, and wherein in a cross-sectional view perspective, the third portion of the trace layer is spaced apart from the second portion of the trace layer and the first portion of the trace layer, a first surface of the third portion of the trace layer is substantially aligned with the first surface of the first substrate, and the dielectric layer contacts the entire first surface of the third portion of the trace layer.

10. A semiconductor package structure, comprising:
    a first package, comprising:
       a first substrate having a first surface and a second surface opposite to the first surface;
       a trace layer embedded in the first substrate and proximal to the first surface of the first substrate;
       a first conductive pillar connected to the trace layer; and
       a first conductive via connecting the first conductive pillar to the second surface of the first substrate, wherein the first conductive via and the first conductive pillar are within a same layer of the first substrate;
    a second package disposed on the first surface of the first substrate of the first package; and a conductive layer below the first conductive via, and a thickness of the conductive layer is less than a thickness of the trace layer.

11. The semiconductor package structure of claim 10, further comprising an electronic component embedded in the first substrate and under a first portion of the trace layer.

12. The semiconductor package structure of claim 11, wherein the electronic component has an active surface facing the trace layer, and the first substrate comprises a portion extending between the trace layer and the active surface of the electronic component.

13. The semiconductor package structure of claim 12, further comprising a second electronic component embedded in the first substrate and under a second portion of the trace layer, wherein the second portion of the trace layer is spaced apart from the first portion of the trace layer.

14. The semiconductor package structure of claim 13, wherein the second electronic component has an active surface facing away from the trace layer.

15. The semiconductor package structure of claim 13, wherein the first portion of the trace layer is spaced apart from the second portion of the trace layer by a portion of the first substrate.

16. The semiconductor package structure of claim 10, wherein a central axis of the first conductive pillar is misaligned with a central axis of the first conductive via in a vertical direction.

17. The semiconductor package structure of claim 10, wherein the trace layer has a top surface and a bottom surface opposite to the top surface, the first conductive pillar is connected to the bottom surface of the trace layer, and the first surface of the first substrate is aligned with the top surface of the trace layer.

* * * * *